United States Patent
Oglesbee et al.

(10) Patent No.: US 6,608,470 B1
(45) Date of Patent: Aug. 19, 2003

(54) OVERCHARGE PROTECTION DEVICE AND METHODS FOR LITHIUM BASED RECHARGEABLE BATTERIES

(75) Inventors: John Wendell Oglesbee, Watkinsville, GA (US); Arthur G. Burns, Plantation, FL (US); Georgina More, Lakeland, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/578,311

(22) Filed: May 25, 2000

Related U.S. Application Data

(63) Continuation of application No. PCT/US99/01910, filed on Jan. 29, 1999.
(60) Provisional application No. 60/073,279, filed on Jan. 31, 1998.

(51) Int. Cl.[7] ................................................. H02J 7/00
(52) U.S. Cl. ........................................ 320/136; 320/135
(58) Field of Search .............................. 320/136, 135, 320/134, 137, 127; 324/426, 427; 307/109, 110

(56) References Cited

U.S. PATENT DOCUMENTS

| | | | | |
|---|---|---|---|---|
| 3,643,153 A | * | 2/1972 | Hanson et al. ................. | 322/33 |
| 5,737,170 A | * | 4/1998 | Moyer .......................... | 361/103 |
| 5,847,951 A | * | 12/1998 | Brown et al. ................ | 363/147 |
| 6,331,763 B1 | * | 12/2001 | Thomas et al. ............. | 320/136 |
| 6,347,029 B1 | * | 2/2002 | Ouyang et al. ............ | 361/93.9 |

* cited by examiner

*Primary Examiner*—Edward H. Tso
*Assistant Examiner*—Lawrence Luk
(74) *Attorney, Agent, or Firm*—Philip H. Burrus, IV

(57) ABSTRACT

A protection circuit (100) and protection device (300) for protecting a rechargeable (lithium-based) battery cell or cells from overcharging. A voltage regulator element (110, 310) is connected in parallel with the battery cell or cells (5) and is thermally coupled to a thermal element (120, 322, 326) connected in series with the charging current supply. The voltage regulator element (110, 310) prevents overcharging of the battery (5) by shunting current away from the battery when a predetermined voltage across the battery is exceeded. Moreover, the thermal element (120, 322, 326) prevents failure of the voltage regulator element (110, 310) by open circuiting the current path when the heat dissipated by the voltage regulator element (110, 310), thermally coupled to the thermal element (120, 322, 326) causes the thermal element to enter a high resistance state. Additional protection may be provided by fuse bonds (332, 334) connecting the combination of the shunt voltage regulator 310 and the thermal elements (322, 326) to the charging current supply and to the battery (5).

23 Claims, 8 Drawing Sheets

OVERCHARGE PROTECTION DEVICE AND METHODS FOR LITHIUM BASED RECHARGEABLE BATTERIES

RELATED APPLICATION

"This application is a continuation of PCT application No. PCT/US99/01910, filed Jan. 29, 1999, which claims the benefit of U.S. Provisional Application No. 60/073,279, filed Jan. 31, 1998."

FIELD OF THE INVENTION

The present invention is directed to rechargeable batteries, such as lithium-ion or lithium-polymer rechargeable battery cells and other rechargeable battery chemistries, and in particular to overcharge protection circuits and devices therefor.

BACKGROUND OF THE INVENTION

Lithium based rechargeable battery cells are subject to potentially unsafe failure modes if severely overcharged. Numerous methods of prior art overcharge protection have been proposed and implemented in lithium cell products and battery pack products to avoid the potential serious consequences of overcharge conditions. Few of these methods provide fully adequate protection at a very low cost. Many of these methods are not fail-safe in nature. Moreover, few known methods of overcharge protection have been proposed that can be included in the battery cell structure.

U.S. Pat. No. 5,608,307 to Garrett et al. discloses a shunt regulator control method for batter packs. However, this prior art control method is primarily responsive to excess charging current, which may not adequately protect a lithium battery cell. In addition, this prior method does not address protection for the shunt regulator device from thermal run-away due to high power dissipation, particularly under overload charging conditions that might occur from a run-away defective battery charger. Moreover, the prior method does not include provisions to be fully fail-safe.

It is desirable to provide a protection device for use with lithium battery cells and other battery cell chemistry applications to protect the battery cells from overcharge conditions, and including optional additional features to achieve fail-safe protection by protecting the circuit elements themselves that protect the battery cells.

DETAILED DESCRIPTION OF A PREFERRED EMBODIMENT

Figure 1:
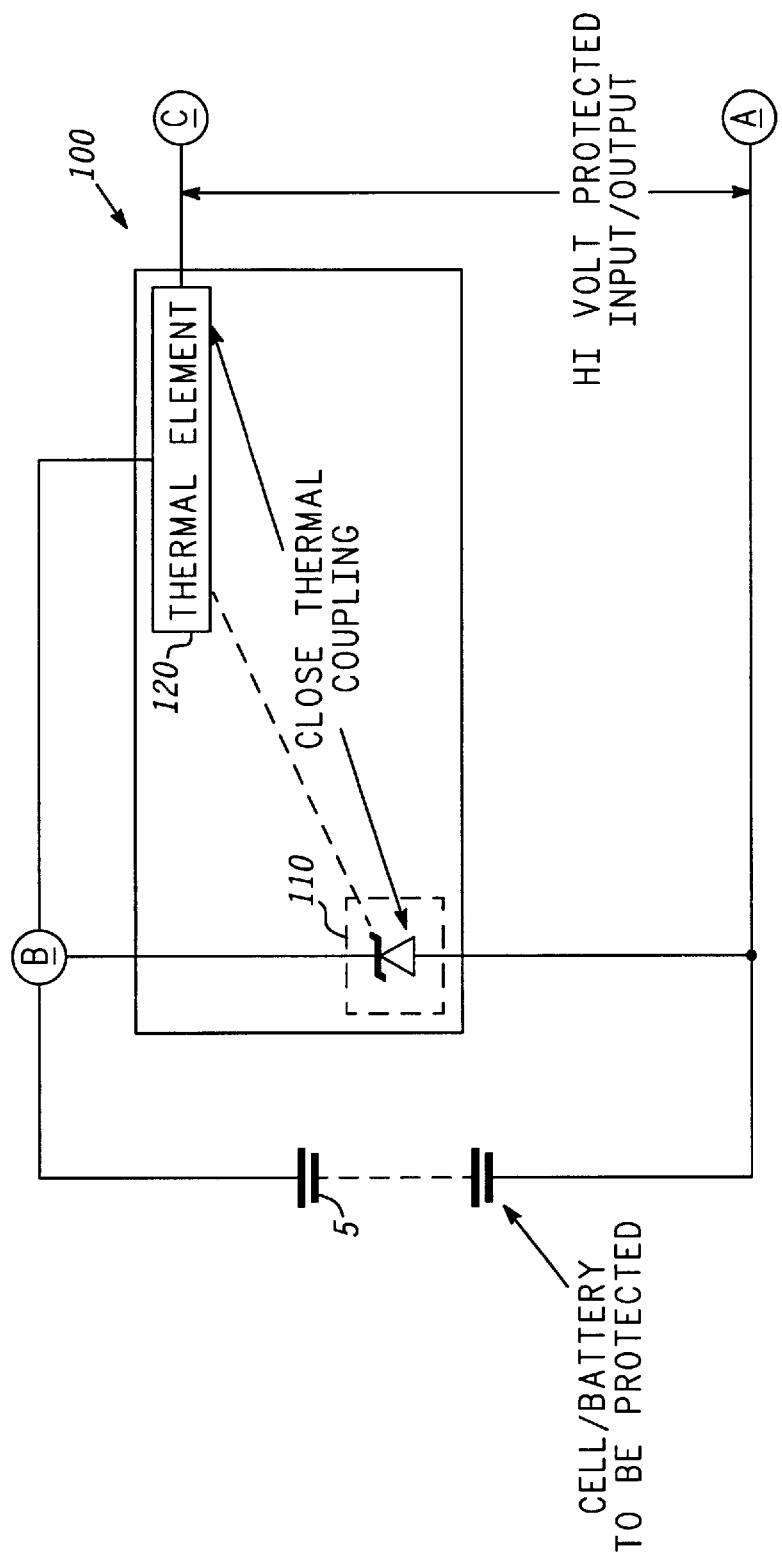
FIG. 1 is a schematic diagram of a protection circuit according to one embodiment of the present invention.
Figure 2:
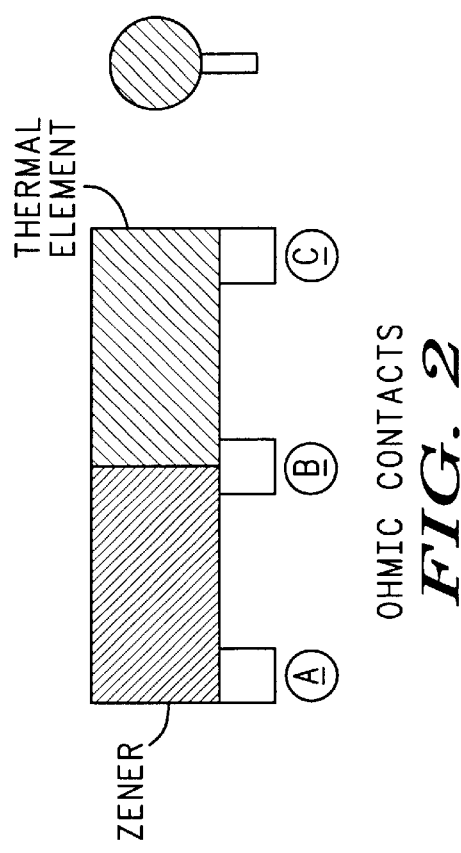
FIG. 2 is a cross-sectional view showing the physical arrangement of the elements of the protection circuit shown in FIG. 1.

Referring first to FIGS. 1 and 2, a protection circuit according to a first embodiment of the present invention is shown at reference numeral 100. The protection circuit 100 comprises a voltage regulator element 110 and a thermal (switch) element 120. The voltage regulator element 110 is connected in shunt (more specifically in parallel) with the terminals of the battery/cells 5 to be protected. The thermal element 120 is connected in series with the voltage regulator element 110 and with the terminals to which a charging current is to be supplied. The voltage regulator element 110 and the thermal element 120 are thermally coupled to each other as represented by the dashed lines between them. The manner in which the thermal coupling is achieved is explained hereinafter.

The voltage regulator element 110 and the thermal element 120 can be incorporated within or as part of the battery 5, affixed to an individual cell of the battery or contained in integrated assembly or package (FIG. 2). The voltage regulator element 110 may be embodied as a zener diode, or as an active voltage regulator. The thermal element 120 is a temperature sensitive switch that opens under high temperature conditions. The thermal element 120 may be embodied as a thermal fuse, thermostat, a solid state thermal resistor or any other temperatures sensitive switch that opens above a predetermined temperature. Examples of suitable thermal resistors are the PTC devices manufactured by Bourns Corp., a resettable fuse device manufactured by Panasonic Corp., and the PolySwitch™ thermal resistor manufactured by Raychem Corp. In general, the term "thermal resistor" when used herein means an element that has a low resistance within a predetermined "normal" operating temperature range, but whose resistance increases (preferably non-linearly) to a very high resistance value at high temperatures. Therefore, a thermal resistor acts like a short circuit at low temperatures and like an open circuit at high temperatures. The term "resistive element" is used hereinafter to refer to that portion of a thermal resistor that is active, i.e., that increases in resistance in response to increases in temperature.

With reference to FIG. 2, a possible physical configuration of the protection circuit 100 is shown. The voltage regulator 110 (in particular a zener diode) and the thermal element 120 are combined within a common housing. Contacts A, B and C correspond to those points in the schematic of FIG. 1, and make connections to the voltage regulator 110 and thermal element 120 as shown.

When a zener diode is selected for use as the voltage regulator 110, it is selected such that the open circuit voltage of the battery 5 is less than the zener voltage of the zener diode. Therefore, the current from the battery will not be drained when it is not being charged.

The following is a description of the operation of the protection circuit 100, with a zener diode used as the voltage regulator element 110. If and when during charging of the battery 5, the voltage across the battery 5 reaches the zener voltage and continues to rise, the zener diode will conduct current away from the battery heavily and consequently will dissipate energy (heat). By diverting current away from the battery 5, the zener diode prevents overcharging of the battery 5. Further, if the voltage across the battery 5 continues to rise, eventually all of the charging current from the battery charger is diverted to the zener diode. When this occurs for a sufficient period of time, the zener diode temperature rise may become excessive, and consequently there is a risk of zener thermal failure. To prevent thermal failure of the zener diode, the thermal element 120, thermally coupled to the zener diode, will begin to heat up and eventually open circuit the charging current at a predetermined temperature. When the thermal element 120 open circuits, no further charging of the battery 5 will occur beyond a maximum cutoff voltage determined by the characteristics of the zener diode and the thermal element 120. Also, no further temperature rise will occur in the zener diode.

Depending on the type of thermal resistor chosen, this may result in a permanent open circuit conditions if a thermal fuse is chosen, a temporary open circuit when a thermostat is used (until the thermostat has cooled) or a temperature very high resistance in series with the battery when a thermal resistor is used. Thus, the voltage regulator 110 protects the battery against overcurrent during charging and discharging, and particularly, at the end of a charging cycle, the voltage regulator 110 prevents overvoltage on the battery. The thermal element 120 prevents thermal damage to the voltage regulator 110 by interrupting charging current from a battery charger once the voltage regulator 110 has sufficiently heated up.

Figure 3:
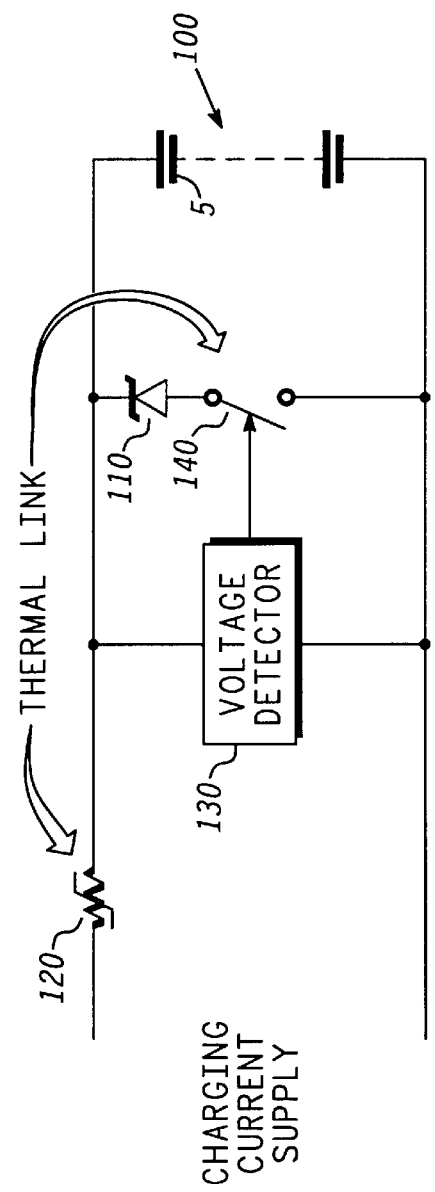
FIG. 3 is a block diagram showing a modification to the protection circuit of FIG. 1.
Figure 4:
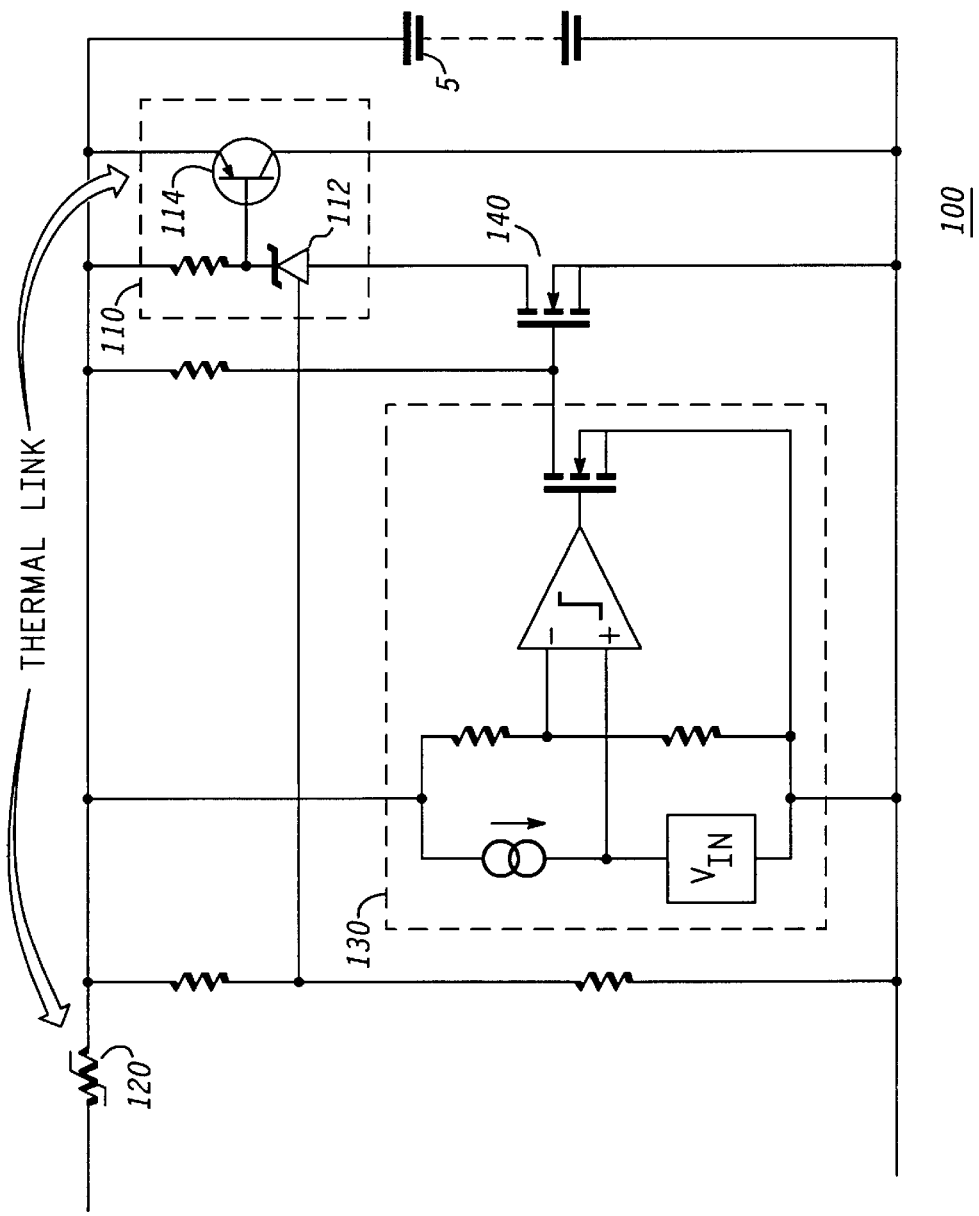
FIG. 4 is a schematic diagram showing the modification of FIG. 3 in greater detail.

FIGS. 3 and 4 are diagrams of further modifications of the protection circuit 100 shown in FIG. 1. In FIG. 3, the protection circuit 100 is further provided with a voltage detector 130 connected in parallel with the voltage regulator 110 and a switch 140 connected in series with the voltage regulator 110. These additional elements are useful when the voltage across the battery 5 is below the regulator voltage. In this case, the voltage detector detects that the voltage is below the predetermined regulation voltage of the voltage regulator 110, and opens the switch 140 so that the regulator is shut off from the circuit, thereby minimizing leakage current of the voltage regulator 110. The switch 140 prevents possible slow discharging of the battery 5 caused by leakage current of the voltage regulator 110.

FIG. 4 shows the modifications of FIG. 3 in greater detail. In this diagram, the voltage regulator 110 consists of a combination of a zener diode 112 and a bipolar transistor 114 (configured as a power amplifier). The voltage detector 130 is connected to a field effect transistor (FET) switch 140. The voltage regulator 110 is thermally coupled to the thermal element 120 through the bipolar transistor 114. As current is diverted through the voltage regulator 110, the bipolar transistor will heat up and this thermal energy is transferred to the thermal element 120. Operation of the voltage regulator 110 and thermal element 120 in the configuration of FIG. 4 is as explained above in conjunction with FIG. 1. The voltage detector 130 and the switch 140 operate as explained above in conjunction with FIG. 3.

Figure 5:
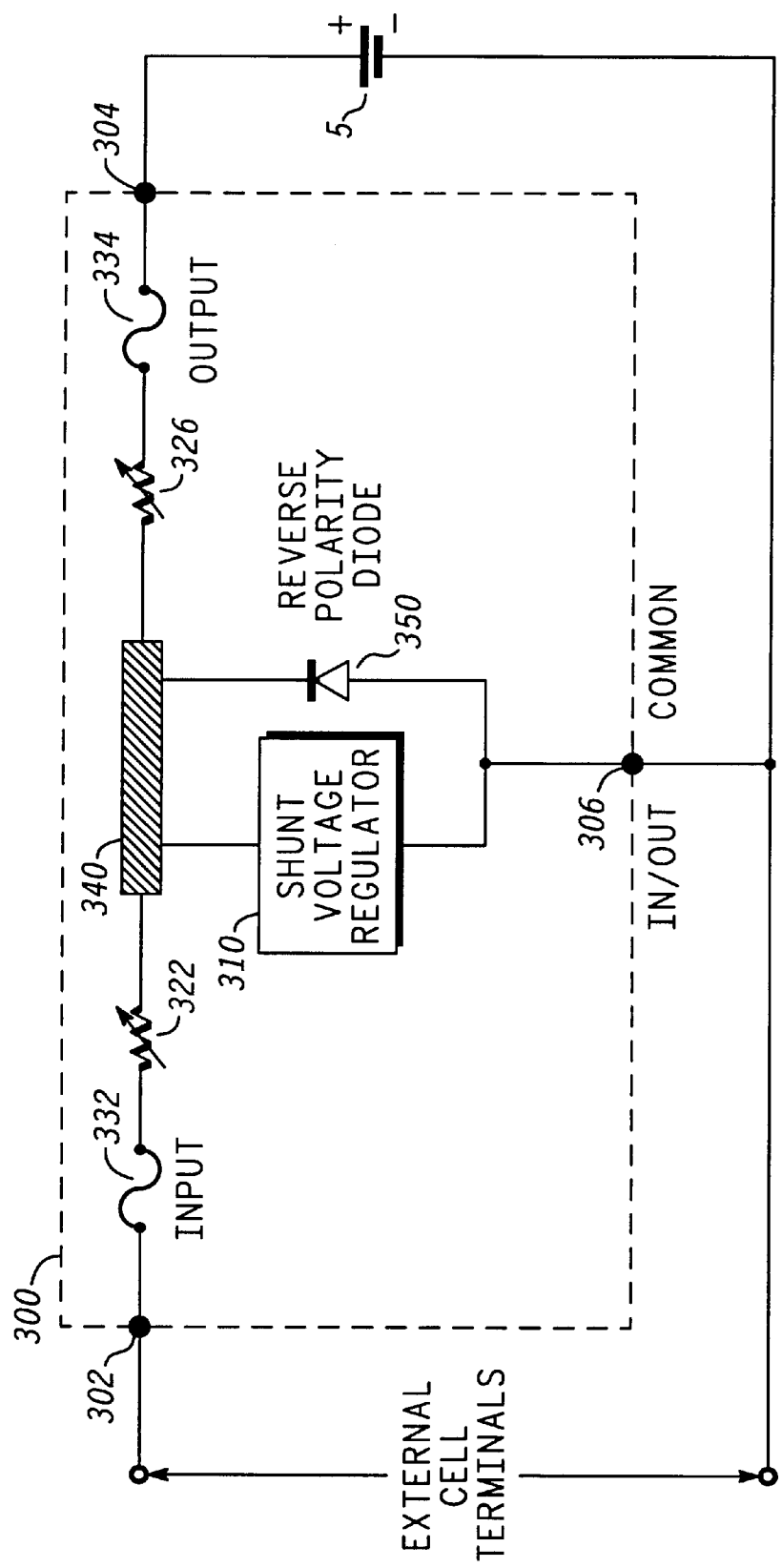
FIG. 5 is a schematic diagram of a power hybrid protection device according to another embodiment of the present invention.

Turning to FIG. 5, a protection device 300 according to another embodiment of the present invention is shown. The protection device 300 comprises a shunt voltage regulator 310 and at least one thermal resistor 322. The input terminal 302 to the protection device 300 is at the thermal resistor 322. The input terminal 302 is for connection to a battery charger. The output terminal 304 of the protection device 300 is for connection to a battery 5 to be protected. The shunt voltage regulator 310 is connected between the input terminal 302 and the common terminal 306.

Another important element of the protection circuit 300 is a fuse bond 322. The fuse bond 332 connects between the combination of the shunt voltage regulator 310 and thermal resistors 322 and the input terminal.

In its simplest and minimum configuration, the protection device 300 comprises the shunt voltage regulator 310 and the thermal resistor 322. The shunt voltage regulator and the thermal resistor 322 are thermally coupled to each other by a heat spreader element shown at reference numeral 340. The heat spreader element 340 is described in more detail hereinafter.

All of the other elements shown in FIG. 5 are optional. For example, there is an optional thermal resistor 326 that is connected between the shunt voltage regulator 310 and the output terminal of the protection device 300. There is an optional fuse bond 334 that connects between the thermal resistor 326 and the output terminal of the protection device 300. In addition, there is an optional reverse polarity diode 350 connected in parallel with the shunt voltage regulator 310. The reverse polarity diode 350 will be described further hereinafter.

The shunt voltage regulator 310 is, for example, a monolithic silicon semiconductor die element, and is designed and manufactured using well known linear technology and circuit techniques that are identical to those used in the more common and widely available linear style series voltage regulator integrated power circuits. The term "monolithic" is meant to indicate that it is in a single piece of silicon.

The shunt voltage regulator 310 protects the battery 5 from excess charging voltage. It has a significant advantage for overvoltage protection applications because failure of the power device can be optimized to occur in a shorted configuration, which is fail-safe from the standpoint of overvoltage protection. Many prior art protection methods use a series pass power element. When a series element fails, overvoltage and over charge protection may be lost, and therefore, such devices are not fail-safe.

The thermal resistor 322 (and 326) is a temperature sensitive (positive coefficient) non-linear resistor. An example of a suitable thermal resistor is the Polyswitch™ device, manufactured by Raychem Corp., described above. In addition, the other thermal elements made by Bourns and Panasonic are also suitable for use in the protection device 300. The thermal resistor 322 (and 326) has a very low "normal" resistance, and its resistance abruptly changes to a high voltage (ON to OFF state) at a device temperature between approximately 80 and 85 degrees C.

The heat spreader element 340 thermally couples the shunt voltage regulator 310 to the thermal resistor 322 (and 326). The heat element 310 is, for example, made of copper or similar material suitable for soldering other components to it. The copper may be plated with tin or nickel. The thermal coupling of the thermal resistor 322 (and 326) to the semiconductor die of the shunt voltage regulator 310 causes the thermal resistor(s) to act as a heat-sink for the semiconductor die of the shunt voltage regulator 310. Therefore, the shunt voltage regulator 310 is protected from overtemperature conditions. Integrated into a hybrid power assembly package, the thermal resistors prevent overvoltage charging conditions from being applied to the battery 5, while the overall protection device 300 itself is thermally self-limiting.

The fuse bond 332 (and 334) function as electrical fuse elements. They are an established and highly refined technology for terminating integrated circuit die. By appropriate sizing of the fuse bonds, they are self-fusing and help protect the battery 5 and the shunt voltage regulator 310 from catastrophic stress conditions that might occur.

The fuse bond 332 (and 334) may take one or two forms: wire bonds or bonding straps. The non-renewable fuse bond may consist of a narrowed fusible portion of a terminal strap or fusible bond wire. Electrical fusing characteristics of the bonding straps may be controlled by the size and shape of a narrowed width region in the strap design. These fuse bonds provide important protection in two conditions. The first condition is when charging input overload exceeds the interrupt capability and protection capacity of the primary protection elements of the battery charger. In this case, the primary protection elements are designed to fail short, and the fuse elements then interrupt the resultant fault currents. The second condition is the random failure of the shunt regulator die or thermal resistors in a shorted condition.

Referring back to FIG. 5, the optional reverse polarity voltage clamping diode 350 is connected in parallel with the battery 5. The diode 350 prevents applying a significant reverse voltage across the battery 5, and minimizes charging the battery 5 in the reverse direction. In some monolithic designs, it is possible that the diode 350 is integrated in the die with the shunt voltage regulator 310. Alternatively, a separate diode semiconductor die may be provided.

Figure 6:
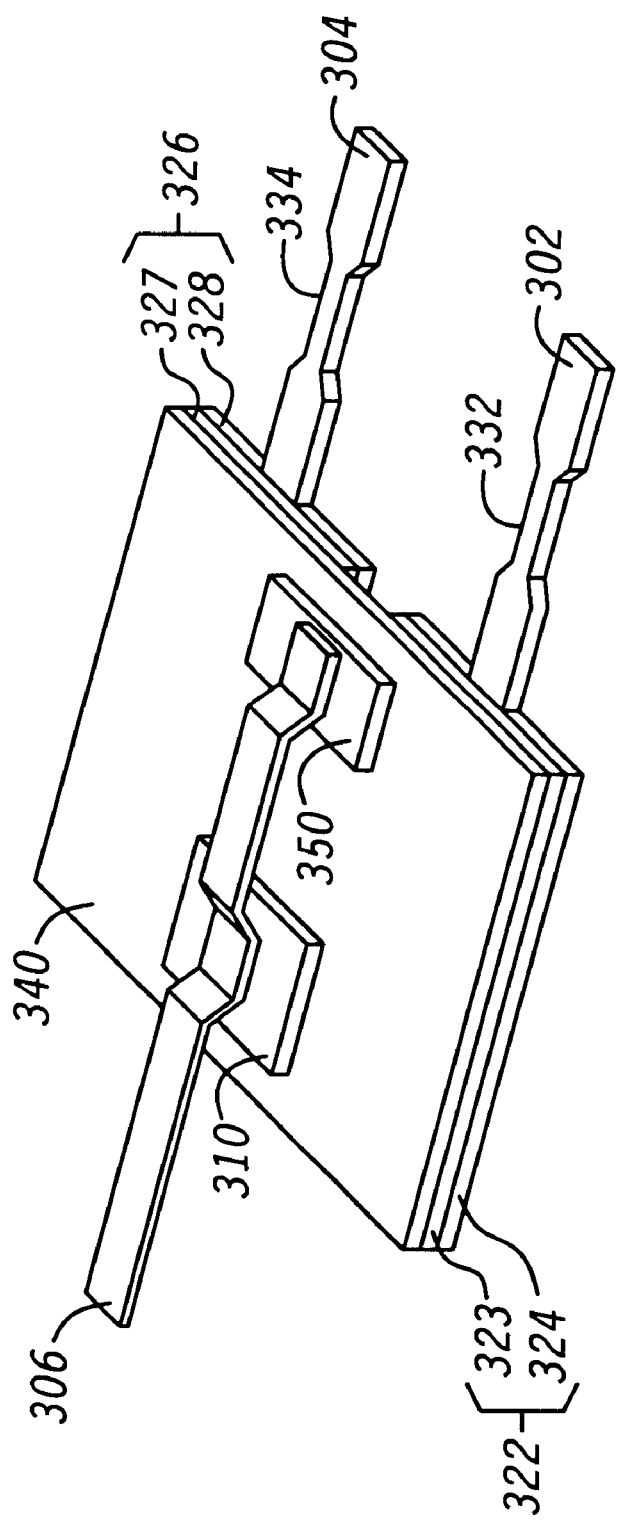
FIG. 6 is a perspective view of a possible physical configuration of the various elements of the power hybrid protection device in FIG. 5.

Turning to FIG. 6, a preferred physical embodiment of the protection circuit 300 is shown in which the elements shown in FIG. 5 are assembled into a single power hybrid package. The thermal resistor 322 comprises a resistive or active element layer 323 and a contact or conductive layer 324. Similarly, the thermal resistor 326 comprises a resistive element layer 327 and a contact or conductive layer 328. The thermal mass of the resistive element layers 323 and 327 and the thermal heat spreader element 340 is large in comparison to the thermal mass of the semiconductor die of the shunt voltage regulator 310 and the die of the diode 350.

As shown in FIG. 6, the semiconductor die of the shunt voltage regulator 310 and the die of the diode 350 are bonded to the heat spreader 340 and two resistive elements (of the thermal resistors) so that the resistive elements act as a heat sink to the shunt voltage regulator semiconductor die. The bond to the heatspreader and resistive elements has thermal characteristics at least as good as typical similar monolithic device packages. A typical value for the thermal resistance of such a bond is not greater than 1.5 degree C./watt.

At 1000% charging overload (10 amps), the power in the semiconductor die is 43 watts. Therefore the temperature rise of the die junction over that of the heat spreader element and resistive elements is 64.5 degrees C. maximum. The thermal resistors 322 and 326 essentially open circuit at a temperature of 85 degrees C. or more. If the heat spreader element and the thermal resistors approach this temperature the circuit is opened, current is reduced, power is reduced to a steady state maintenance level, and the heat spreader temperature rise stabilizes at this temperature. Since the heatspreader temperature is limited to 85 degrees C., the die junction temperature does not exceed (85+64.5)=149.5 degrees C. Typical silicon semiconductor die operating temperatures range from 150 to 225 degrees C. The die is therefore thermally protected by the thermal resistors 320 for all conditions of overload up to 1000% of rated charging current.

Figure 7:
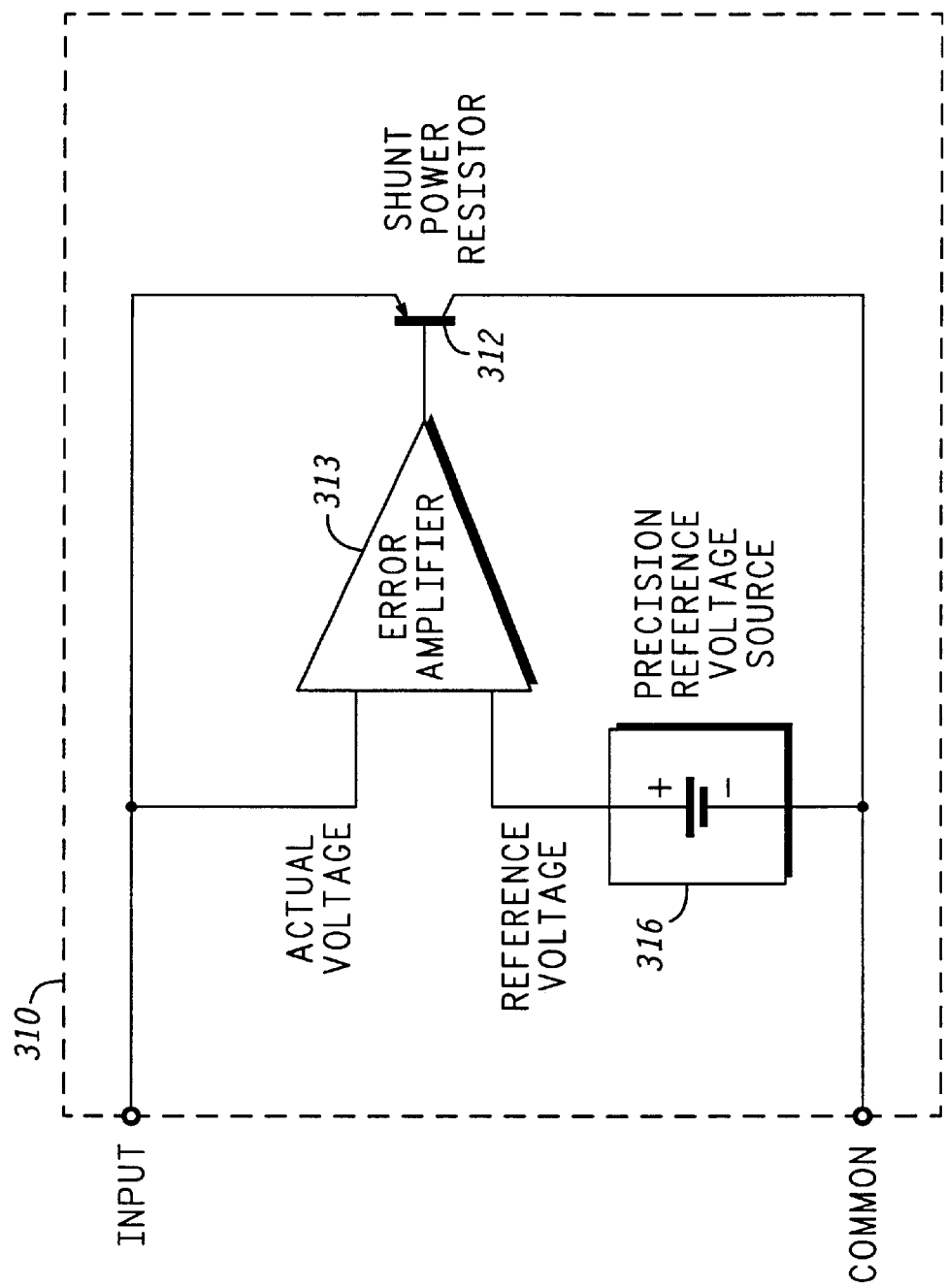
FIG. 7 is a block diagram showing a possible implementation of a shunt voltage regulator suitable for use in the power hybrid protection device.

Turning to FIG. 7, an example of a monolithic integrated circuit (IC) linear shunt voltage regulator 310 is shown. The shunt regulator 310 comprises a power transistor 312, a high gain error amplifier 313 and a precision voltage reference 316. The high gain error amplifier 313 operates to increase the base drive of the power transistor 312, and therefore the shunt current when the voltage across the shunt regulator 310 as compared to the precision reference voltage 316, exceeds a regulation threshold. A suitable form of the shunt voltage regulator integrated in monolithic IC form would be very similar to known monolithic IC series voltage regulators, such as an LM350 device, manufactured and sold by National Semiconductor Corp.

The monolithic IC shunt voltage regulator used according to the present invention preferred has a very low leakage current below its operating voltage, a very sharp "knee" in its voltage vs. current characteristic curve, and a very small voltage increase with current. The regulating voltage can be controlled die trimming techniques, which are well known techniques used in the series regulator.

Figure 8:
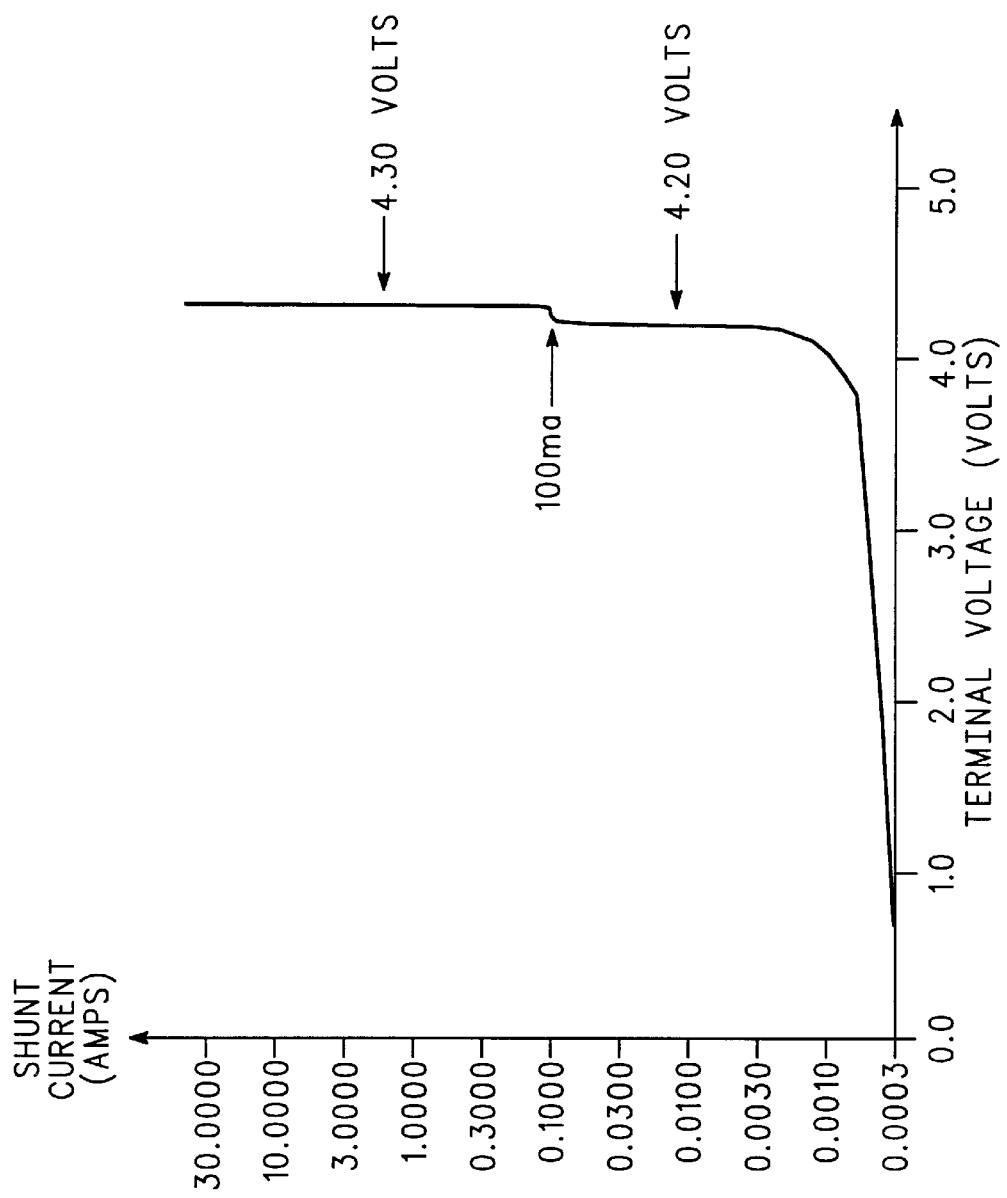
FIG. 8 is a graphical diagram showing the voltage versus circuit characteristic of a shunt voltage regulator suitable for use in the power hybrid protection device.

It is further possible to tailor the shunt voltage regulator characteristics to promote charge balancing. FIG. 8 illustrates a shunt regulator control characteristic curve which has been modified to promote voltage balanced charging of a series combination of multiple cells. The shunt control characteristics have been modified such that below a shunt current of 100 ma, for example, the regulator maintains a constant voltage corresponding to correct termination voltage for "fill up" charging of a lithium cell. With this characteristic, each shunt regulator across each cell in a series string is capable of absorbing up to 100 ma of charging current in order to equalize the termination voltages of each cell. This value of current is chosen to keep the power dissipation in each shunt regulator small. At higher currents, the shunt regulator clamps at a slightly higher voltage to protect each cell from an overcharge condition. The clamping ability depends on the die size, but clamping current capability of 10 to 20 amps is not unreasonable for a typical shunt regulator.

The characteristics of a shunt type monolithic IC linear voltage regulator are better suited for lithium overcharge protection than a zener diode for some applications. The operating characteristics of the monolithic device match closely those required for accurate protection of lithium from both charge imbalance and overvoltage conditions. As shown in FIG. 8, the leakage current at normal battery voltages is well below a value that would cause significant discharge of the cell. The voltage regulator of the monolithic IC is very sharp, and even at extremely high overload currents, the voltage regulator of the shunt type regulator is accurately maintained.

To achieve a fully fail-safe protection device, the shunt voltage regulator is protected from excessive power dissipation. As an example, a lithium cell of 1 amp nominal current capacity has a maximum recommended "rapid" charge rate is 1 amp, for a 1C rate. As is known in the art, the term "C rate" is the charge current rate at which the cell will go from a fully discharged state to a fully charge state in one hour. If the charging current failed to terminate properly, the shunt voltage regulator would clamp the voltage at 4.3 volts to protect the cell from overcharge. The average power dissipation in the shunt device would be 4.3 watts for a fully charged cell at the IC input charge rate. It most cases, it is impractical to dissipate this match heat from a device that is used internally in a battery pack or cell structure. If the battery charger enters a run-away charging mode (fails to shut off), the cell may be subjected to a maximum of 1000% current overload—a charging overload of 10 amps. The power dissipation of a shunt type device in this case could be as much as 43 watt. Therefore, a shunt regulator without auxiliary protection is at risk of thermal run-away.

The thermal resistors protect the shunt voltage regulator from excessive power dissipation. Specifically, these resistive devices protect the shunt regulator semiconductor die from thermal runaway conditions by limiting charging current as die temperature increases. As described above, they also function as a heat sink for the shunt regulator semiconductor die. Still another function is to provide overcurrent protection for discharging currents under extremely sever (short circuit) conditions. Yet another function is to provide backup protection in the event of the failure of the semiconductor die. Finally, these devices disconnect the cell from the charging source in the event of reverse polarity charging.

Figure 9:
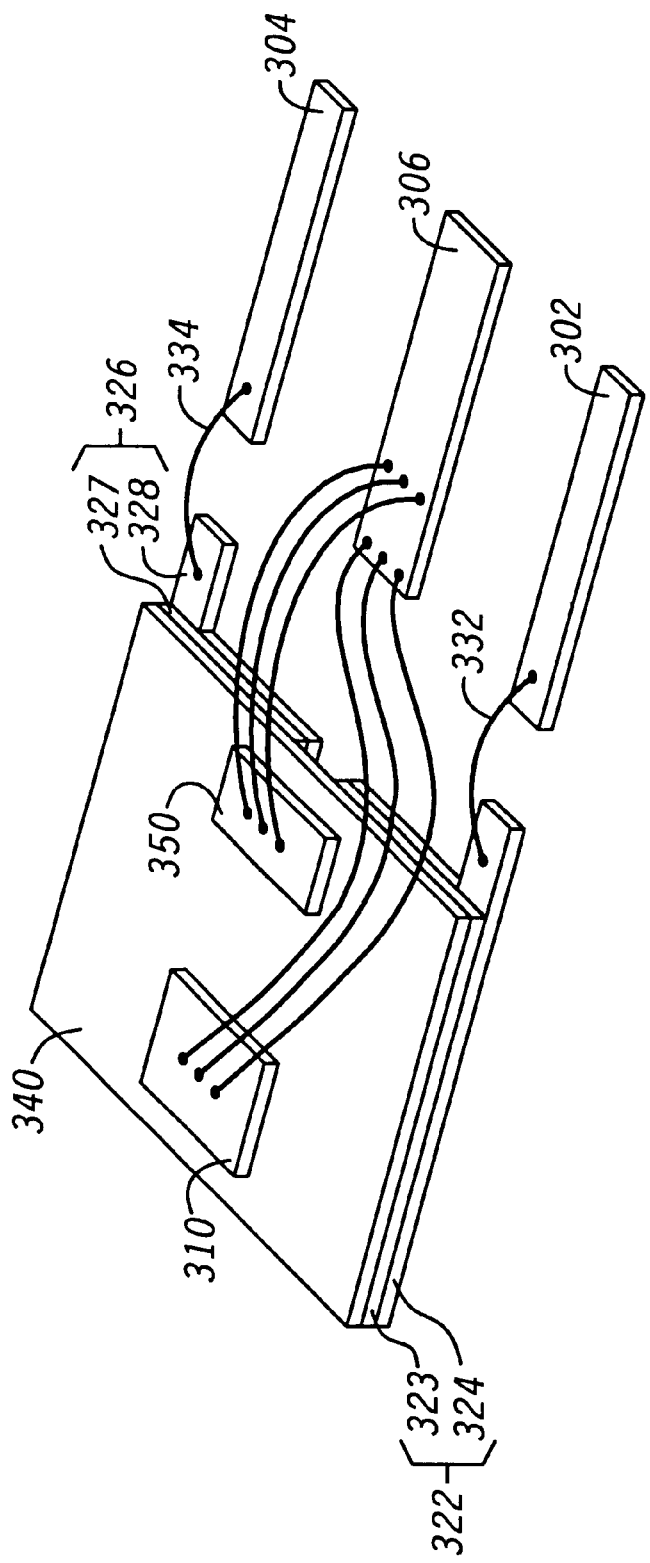
FIG. 9 is a perspective view of a possible physical configuration similar to FIG. 6, but showing the use of wire bonds as opposed to bond straps.

FIG. 9 illustrates an example of a single power hybrid package featuring bond wire elements as opposed to the bond straps shown in FIG. 6. The bond wires are welded to the semiconductor die of the shunt voltage regulator 310 and thermal resistors 322 and 326.

It should be understood, as explained above, that the protection circuit 300 at its core comprises a shunt voltage regulator, at least one thermal resistor thermally coupled thereto and a fuse bond or link coupling the regulator semiconductor die and thermal resistor to the input terminal. Variations on this basic configuration contemplate a thermal resistor and a fuse connecting the shunt voltage regulator to the battery 5. The power hybrid package of FIG. 6 would be slightly different (more or fewer elements) for each variation on this basic configuration.

The invention which has been described has several unique operational and fail-safe features. A description of these features is summarized below for various normal and fail-safe operating modes. Reference is made to FIG. 5 in the following description.

Normal Charging and Discharging: Current and voltage levels during charging and discharging are normal. The shunt regulator draws virtually zero power. The resistive elements, i.e., thermal resistors, are at low temperature, and have low resistance. Charge and discharge current path is through these low resistance elements, dissipating little power. Temperature rise of the hybrid assembly is negligible.

Normal "fill up" charging at termination voltage: As each and any cell approaches normal termination voltage, the shunt regulator draws up to 100 ma to promote even charging of series cells by balancing the termination voltage across each cell. See FIG. 8. This is an optional characteristic of this invention.

Overcurrent (short circuit) Discharging: Discharge current is high through both thermal resistors 322 and 326. Elements self heat resistance changes to a high value, thus limiting discharge current and power. In the extremely unlikely event of failure of both series thermal resistors, fuse links in the discharge path can provide back up short circuit discharge protection.

Overcurrent charging up to 1000% (runaway charger): Shunt regulator limits voltage to safe value by drawing up to 20 amps of shunt current. Power dissipated causes rapid heating of shunt die; and the temperature of the heatspreader and thermal resistors rises to the termination temperature. The thermal resistors change to high resistance state, reducing charging current and stabilizing temperature rise. Cell voltage never exceeds overvoltage protection threshold set by shunt regulator.

Overcurrent charging over 1000%: The die temperature may rise above its functional rating. For this condition the die is designated to fail shorted, thus still protecting the cell from overvoltage. With a shorted die, the cell discharges into the shorted die. Heating of thermal resistor 326 due to cell discharge overcurrent protects the shorted cell as thermal resistor 326 changes to a high resistance state. Continued input charging current also heats thermal resistor 322 cutting off and reducing the input charging current. The hybrid protection device permanently fails in a safe manner.

High voltage and high current charging: Input voltage and current may exceed the interrupt ratings of the thermal resistor 322. The shunt regulator die is designed to fail shorted. The thermal resistor 322 fails shorted. Thermal resistor 326 operates as above to prevent short circuit of the cell. Fuse link 332 interrupts the charging current fault. If thermal resistor 326 should also fail shorted, fuse link 334 protects the cell from the short-circuited die. The hybrid device permanently fails in a safe manner.

Low level reverse charging: Reverse protection diode protects cell from excessive reverse voltage charging. The cell and hybrid device are protected and not damaged.

High level reverse changing: Reverse protection diode 350 blocks significant reverse voltage across the cell. Cell discharge current is limited by temperature rise of thermal resistor 326, backed up by fuse link 334 in the event of failure of thermal resistor 326. Continued reverse current heats the diode die and thermal resistor 322, until thermal resistor 322 opens to limit the temperature rise. If thermal resistor 322 should fail, fuse link 332 still opens the circuit. The hybrid device permanently fails in a safe manner.

High voltage and high current reverse charging: Input voltage and current exceed the interrupt ratings of the thermal resistor 322. The diode die is designed to fail shorted. The thermal resistor 322 fails shorted. Thermal resistor 326 operates to prevent short circuit of the cell. Fuse 332 interrupts the reverse charging current fault. If thermal resistor 326 should also fail shorted, fuse link 334 protects the cell from the short circuited diode die. The hybrid device permanently fails in a safe manner.

Random Failure of Shunt regulator die, or diode die, shorted: Overcurrent heats thermal resistors 322 and 326 to the termination temperature, and the circuit is opened. Failure of either thermal resistor 322 or thermal resistor 326 is backed up by fuse links 332 and 334. The hybrid device permanently fails in a safe manner.

Random Failure of either resistor shorted: Failure of either thermal resistor 322 or thermal resistor 326 is backed up by fuse links 332 and 334. The hybrid device permanently fails in a safe manner.

Random Failure of either resistor or either fuse link open: The cell is disconnected by the open circuit. The hybrid device permanently fails in a safe manner.

Cell Temperature greater than 85 degrees C.: If the hybrid device is thermally coupled to the cell, the cell can neither charge or discharge at high temperatures because the resistive elements open at high temperatures.

In manufacturing the protection circuits and devices according to the present invention, it may be preferable to design the thermal resistor elements to address the packaging characteristics and requirements according to integrate the protection circuit or device into the battery pack. In addition, it may be preferable to design the semiconductor integrated circuit elements (shunt voltage regulator) in a similar manner. These two components could then be assembled together to fabricate the overall device by gluing, soldering, welding, crimping, clamping and other known circuit assembling techniques.

In summary, the present invention is directed to a battery protection circuit comprising: a voltage regulator for connection in shunt across terminals of a rechargeable battery to prevent charging of the rechargeable battery over a predetermined voltage; and a thermal element connected in series with the voltage regulator element and for connection to a supply of charging current, the thermal element being thermally coupled to the voltage regulator; wherein the thermal element is responsive to heat coupled to it from the voltage regulator caused by dissipation of energy within the voltage regulator so as to open and disconnect the rechargeable battery from charging current when a voltage across the voltage regulator element exceeds a predetermined threshold.

In accordance with another aspect of the invention, the present invention is directed to a protection device having an input terminal for connection to a supply of charging current and an output terminal for connection to a terminal of a rechargeable battery cell or cells to be protected, the protection device comprising: a first thermal resistor connected in series with the input terminal; and a shunt voltage regulator connected between the first thermal resistor and ground (here a common terminal between input and output, as shown in FIG. 5); wherein the shunt voltage regulator is thermally coupled to the first thermal resistor and prevents charging of the battery over a predetermined voltage by causing the first thermal resistor to enter a high impedance state when the voltage across the output terminal exceeds a predetermined voltage.

Further still, according to another aspect, the present invention is directed to a method for protecting a rechargeable battery from overcharging comprising: placing a voltage regulating element in parallel with the rechargeable battery to shunt current away from the rechargeable battery when voltage across the rechargeable battery exceeds a predetermined threshold; and thermally coupling a temperature sensitive resistive element to the voltage regulating element and connecting the resistive element in series with a charging current supply so that the temperature sensitive resistive element enters a high impedance state effectively open circuiting a charging current path to the rechargeable battery in response to heat dissipation of the voltage regulating element caused by overcharging of the rechargeable battery.

The foregoing description is intended by way of example only and is not intended to limit the present invention in any way except as set forth in the following claims.

What is claimed is:

1. A batter protection circuit comprising:
   a voltage regulator for connection in shunt across terminals of a rechargeable battery to prevent charging of the rechargeable battery over a predetermined voltage; and
   a thermal element connected in series with the voltage regulator element and for connection to a supply of charging current, the thermal element being thermally coupled to the voltage regulator;
   wherein the thermal element is responsive to heat coupled to it from the voltage regulator caused by dissipation of energy within the voltage regulator so as to open and disconnect the rechargeable battery from charging current when a voltage across the voltage regulator element exceeds a predetermined threshold.

2. The battery protection circuit of claim 1, wherein the voltage regulator is a zener diode.

3. The battery protection circuit of claim 1, wherein the voltage regulator and the thermal element are combined within a single integrated circuit.

4. The battery protection circuit of claim 1, wherein the voltage regulator is a monolithic semiconductor integrated circuit shunt voltage regulator.

5. The battery protection circuit of claim 4, wherein the voltage regulator and the thermal element are combined in a single integrated assembly.

6. The battery protection circuit of claim 1, wherein the thermal element is a member selected from the group comprising a thermal fuse, thermostat, solid state thermal switch, and a non-linear positive coefficient thermal resistor.

7. A rechargeable battery comprising at least one cell and the circuit of claim 1 integrated therewith.

8. A battery protection circuit of claim 1, and further comprising fuse bonds for connecting the voltage regulator and the thermal element to terminals of a battery charger and terminals of the battery to be charged.

9. The battery protection circuit of claim 8, wherein the fuse bonds are bond straps.

10. The battery protection circuit of claim 8, wherein the fuse bonds are wire bonds.

11. The battery protection circuit of claim 1, and further comprising a heatspreader element for thermally coupling the voltage regulator to the thermal resistor.

12. The battery protection circuit of claim 1, and further comprising a reverse polarity diode connected in parallel with the voltage regulator.

13. A power hybrid protection device having an input terminal for connection to a supply of charging current and an output terminal for connection to a terminal of a rechargeable battery cell or cells to be protected, the protection device comprising:
   a first thermal resistor connected in series with the input terminal; and
   a shunt voltage regulator connected between the first thermal resistor and ground;
   wherein the shunt voltage regulator is thermally coupled to the first thermal resistor and prevents charging of the battery over a predetermined voltage by causing the first thermal resistor to enter a high impedance state when the voltage across the output terminals exceeds a predetermined voltage.

14. The protection device of claim 13, and further comprising a heat spreader circuit that thermally couples the first thermal resistor and the shunt voltage regulator.

15. The protection device of claim 13, and further comprising a first fuse bond connecting the first terminal resistor to the input terminal, the first fuse bond responsive to short circuit failure of the shunt voltage regulator or the first thermal resistor, to open circuit and prevent current flow into or out of the input terminal.

16. The protection device of claim 15, and further comprising a second thermal resistor connected in series between the shunt voltage regulator and the output terminal, the second thermal resistor being thermally coupled to the shunt voltage regulator and entering a high impedance state when the voltage across the output terminals exceeds a predetermined voltage.

17. The protection device of claim 16, and further comprising a second fuse bond connecting the second thermal resistor to the output terminal, the second fuse bond responsive to short circuit failure of the shunt voltage regulator or the second thermal resistor, to open circuit and prevent current flow into or out of the battery cell.

18. The protection device of claim 17, and further comprising a heat spreader element that thermally couples the first and second thermal resistors to the shunt voltage regulator.

19. The protection device of claim 13, and further comprising a second thermal resistor connected in series between the shunt voltage regulator and the output terminal, the second thermal resistor being thermally coupled to the shunt voltage regulator.

20. The power hybrid protection device of claim 13, and further comprising a reverse polarity diode connected in parallel with the shunt voltage regulator.

21. The power hybrid protection device of claim 20, wherein the shunt voltage regulator and the reverse polarity diode are implemented in a monolithic semiconductor integrated circuit die.

22. The power hybrid protection device of claim 13, and further comprising a heat spreader element for thermally coupling the shunt voltage regulator to the first thermal resistor, wherein the shunt voltage regulator is implemented on a monolithic semiconductor integrated circuit die, the first thermal resistor comprises a resistive element layer and a conductive layer, the resistive element layer of the first thermal resistor and the monolithic semiconductor integrated circuit die being disposed in contact with the heat spreader element and the input terminal being disposed in contact with the conductive layer of the first thermal resistor and the output terminal being disposed in contact with the monolithic semiconductor integrated circuit die.

23. A method for protecting a rechargeable battery from overcharging comprising:

placing a voltage regulating element in parallel with the rechargeable battery to shunt current away from the rechargeable battery when voltage across the rechargeable battery exceeds a predetermined threshold; and thermally coupling a temperature sensitive resistive element to the voltage regulating element and connecting the resistive element in series with a charging current supply so that the temperature sensitive resistive element enters a high impedance state effectively open circuiting a charging current path to the rechargeable battery in response to heat dissipation of the voltage regulating element caused by overcharging of the rechargeable battery.

* * * * *